United States Patent [19]
Delfino

[11] 3,957,604
[45] May 18, 1976

[54] METHOD AND APPARATUS FOR ISOTHERMAL CRYSTAL GROWTH
[75] Inventor: Michelangelo Delfino, Ossining, N.Y.
[73] Assignee: North American Philips Corporation, New York, N.Y.
[22] Filed: Mar. 17, 1975
[21] Appl. No.: 558,935

[52] U.S. Cl. ............................. 204/130; 204/129; 204/274; 204/278
[51] Int. Cl.² ...................... C23B 1/04; C23B 9/00
[58] Field of Search .......... 204/129, 274, 278, 130; 23/295, 301 R, 301 SP, 305 R

[56] References Cited
FOREIGN PATENTS OR APPLICATIONS
17,399  12/1903  United Kingdom ................. 204/129

OTHER PUBLICATIONS

"Principles of Electroplating and Electroforming" by Blum et al., 3rd Ed., 1958, p. 70.

Primary Examiner—R. L. Andrews
Attorney, Agent, or Firm—Frank R. Trifari; Norman N. Spain

[57] ABSTRACT

Isothermal crystal growth of an aqueous solution of an ionizable salt by means of electrolysis of an aqueous solution of the salt.

10 Claims, 1 Drawing Figure

U.S. Patent   May 18, 1976   3,957,604
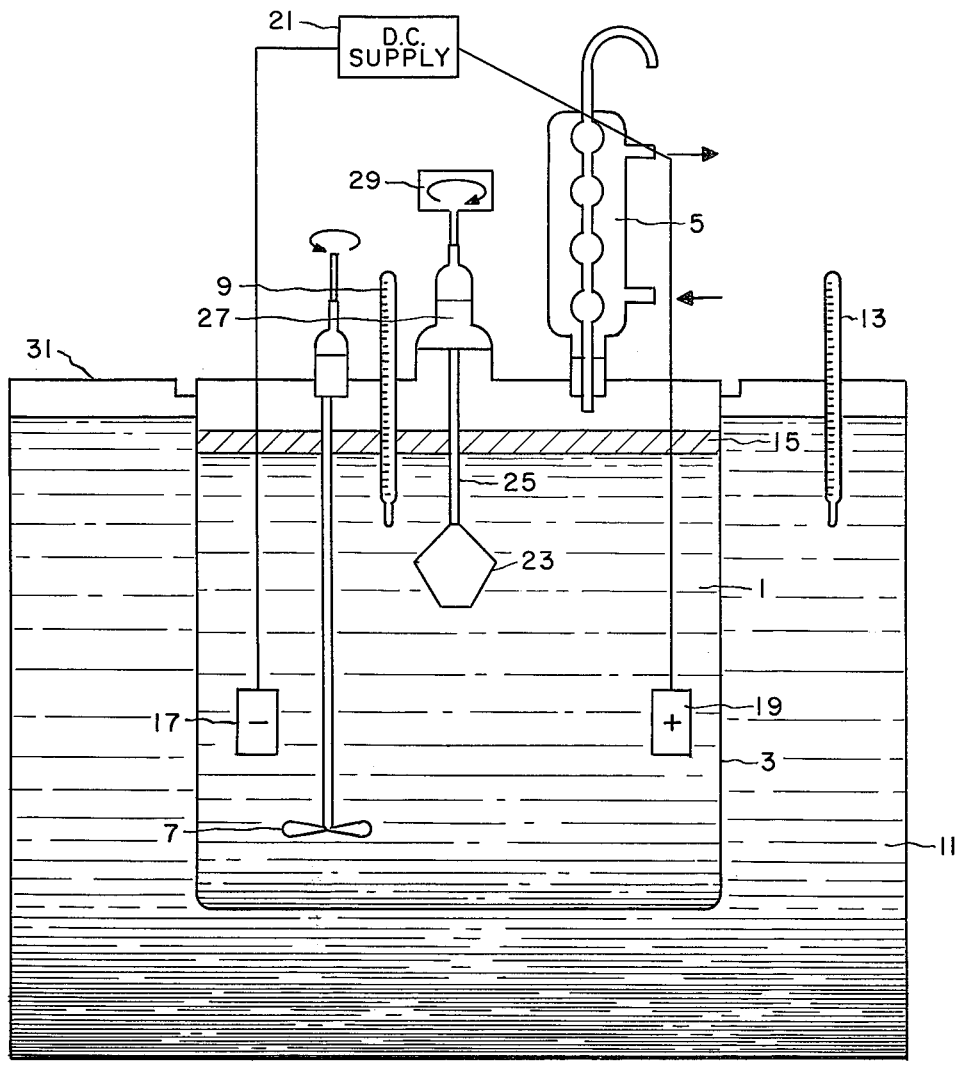

METHOD AND APPARATUS FOR ISOTHERMAL CRYSTAL GROWTH

The invention in this case relates to a new and improved method of crystallization. More particularly, the invention in this case relates to a new and improved method of crystallizing an ionizable salt from an aqueous solution.

Among the best known methods of crystallization from an aqueous solution of a salt is by slow heating or slow cooling of a saturated aqueous solution of the salt.

However, such methods have certain disadvantages.

For example they cannot be employed to grow hydrates since these generally have more than one thermodynamically stable phase and must be grown isothermally in order to control composition.

They also introduce strains in the crystal due to temperature changes.

Further, since crystal growth under such conditions is dependent upon the slope of the solubility curve of the particular salt involved, quantitative control of crystal growth is quite difficult to achieve.

Also certain ionic salts such as $Li_2SO_4H_2O$ exhibit a low negative solubility temperature coefficient ($-0.6g/°C$ per $100gH_2O$) which makes crystal growth by temperature increase of an aqueous solution practically impossible.

Certain other salts, for example $K_2SO_4$ have such low positive temperature solubility coefficients that crystal growth by slowly cooling is highly impractical.

Further, the lanthanide sulfates are significantly more soluble in water at low temperatures, but due to the low vapor pressure and the resultant low rate of evaporation crystal growth by evaporation is generally not possible at temperatures below 20°C.

In order to minimize some of the above-mentioned problems, it has been suggested to employ a method of crystallization by evaporation under isothermal conditions have been developed as shown for example in Gilman. The Art and Science of Growing Crystals, pages 197–206 - John Wiley and Sons, New York, 1963.

However, while these methods of crystallization under isothermal conditions of evaporation eliminate some of the problems of crystallization from an aqueous solution, they still have certain disadvantages. Thus, control of crystal growth remains quite difficult and crystallization of the salts such as the lanthanide sulfates which are significantly more soluble in water at low temperatures remains virtually impossible.

A principal object of this invention therefore is to provide a new and improved method of crystallization from an aqueous solution which avoids the above-mentioned difficulties. Another object of this invention is to provide a method of crystallization from an aqueous solution wherein the rate of crystal growth can be independently controlled.

These and other objects of my invention will be apparent from the description that follows.

According to my invention, I have found that crystals may very satisfactorily be grown from saturated aqueous solutions of ionic salts by subjecting the solution to electrolysis and thereby causing water to be removed from the solution under isothermal conditions.

The method of the invention, hereinafter called aqueous electrolytic crystallization (A.E.C.) may be employed for the crystallization of any ionic salt whose dissociated cation is less easily reduced than H+ and whose dissociated anion is less easily oxidized than OH−.

The A.E.C. method of the invention may be carried out within a broad temperature range (from 0°C<T>100°C), any desired temperature within the broad range being chosen and the crystallization being therefore isothermally carried out at the desired temperature by removal of the liquid water solvent through electrolysis.

In order to prevent evaporation from the surface, it is preferable to float a less dense and immiscible liquid film on the surface of the saturated solution. Examples of liquids which may be employed for this purpose are n-hexane, n-heptane and light mineral oil.

Preferably also, the heat evolved during electrolysis is compensated for, for example, by means of a thermoregulator controlling the temperature of the bath.

Since the method of the invention obeys Faraday's law of electrolysis at a controlled potential, the rate of electrolysis and therefore the rate of supersaturation and crystallization is directly proportional to the current and thus can readily be controlled.

Another important advantage of the inventive method is that growth of the crystal is linear as it is not dependent on the slope of the solubility curve of the compound since the method is carried out under isothermal conditions.

Since the A.E.C. method of the invention operates independently of vapor pressure, it is very useful for the crystallization of the lanthanide sulfates from solution since crystallization can be carried out at temperatures below 20°C when the solubilities of the lanthanide sulfates are higher but the vapor pressures are very low.

Further, since the A.E.C. method of the invention is carried out isothermally, specific hydrates and phases of salts are quantitatively crystallized and crystal strains due to temperature changes are avoided.

Additionally, deuteration, particularly substitution of hydrated water with deuterium oxide is readily carried out.

Further pH adjustment and doping are also easily carried out, pH adjustment being carried out by the addition of an acid such as sulfuric acid or nitric acid, the anion corresponding to the salt to be crystallized or a base such as KOH, the cation corresponding to the cation of the salt to be crystallized.

These and other advantages of the invention will be apparent from the more detailed description that follows:

The invention will now be described in greater detail with reference to the drawing, the sole FIGURE of which shows a crystallizer for carrying out the method of the example and the following example:

Example 1

A solution of 165.0g $K_2SO_4$ in 1000 g of water is acidified to a pH of 4.3 by addition of concentrated sulfuric acid and heated under reflux at a temperature of 80°C while stirring for 20 hours.

The resultant solution 1 is immediately transferred to a 2 1 glass crystallizer 3 fitted with reflux condenser 5, stirrer 7 and thermometer 9 and surrounded by a thermostatically controlled constant temperature bath 11 supplied with thermometer 13.

A layer of mineral oil 15 is then floated on top of the solution 1 in order to prevent spontaneous evaporation and vertical creeping.

A platinized platinum cathode 17 and anode 19 connected to a D.C. current supply 21 are immersed into the solution and the temperature of the solution 1 is reduced to 50°C at the rate of 10°C per hour while stirring is carried out with stirrer 7.

After equilibrium is attained, a constant current of $10^3$ ma cm$^{-2}$ at about 0.5 v is passed onto the cathode 17 and the anode 19 for 72 hours to thereby cause electrolysis to take place and the solution 1 to become supersaturated to the extent of 2%.

At this point a seed crystal 23 of 2 mm × 1 mm × 1 mm of $K_2SO_4$ glued to a lucite rod 25 and connected via a glass joint 25 to a roto motor 29 is lowered into solution 1. A transparent cover 31 is then fitted over the beaker 3 and the constant temperature bath 11.

The seed crystal 21 is then rotated clockwise at 6 R.P.M. while electrolysis of the solution 1 continues to take place and the temperature of the solution 1 is maintained at 50°C by means of the constant temperature bath 11.

During electrolysis the gaseous electrolysis products, hydrogen and oxygen escape via reflux condenser 5 while vapor from the solution 1 is condensed in the reflux condenser 5 and returned to the solution 1.

After six days the current was turned off and a good quality single crystal of $K_2SO_4$ weighing 6.8 g was found to be formed on the lucite rod 23.

In similar fashion there were prepared crystals of $Li_2SO_4 \cdot H_2O$; $RbNO_3$, $Pr_2(SO_4)_3 \cdot 8 D_2O$ (by substitution of $D_2O$ for $H_2O$ as the solvent as well as crystals of other compounds as shown by the following Table.

TABLE

| Compound | Space Group | Current (Amps.) | Temperature (°C) during growth | pH during growth | Crystal (mm) |
|---|---|---|---|---|---|
| $K_2SO_4$ | Pnam | 1.02 | 50 ± 0.02 | 4.3 | 20mm |
| $Li_2SO_4 \cdot H_2O$ | $P2_1$ | 1.43 | 47 ± 0.02 | 6.5 | 5mm |
| $Li_2SO_4 \cdot D_2O$ | $P2_1$ | 1.11 | 35 ± 0.02 | 6.5 | 10mm |
| $RbNO_3$ | P31 m | 0.75 | 40 ± 0.02 | — | 18mm |
| $Ce_2(SO_4)_3 \cdot 8H_2O$ | Bmab | 0.84 | 12 ± 0.02 | — | 3mm |
| $KPF_6$ | Pa3 | 0.47 | 20 ± 0.1 | — | 7mm |
| $Pr_2(SO_4)_3 \cdot 8D_2O$ | C2/c | 0.65 | 8 ± 0.05 | — | 3mm |
| $BeSO_4 \cdot 4H_2O$ | $\overline{I}4c2$ | 0.80 | 59 ± 0.02 | — | 26mm |
| $KNO_3$ | Pnam | 0.80 | 62 ± 0.02 | 9.4 | 42mm |
| $Nd_2(SO_4)_3 \cdot 8H_2O$ | C2/c | 0.71 | 8 ± 0.05 | — | 3mm |

Finally, it should be noted that fluorides may be crystallized according to the method of the invention by use of a suitable apparatus made of a suitable resistant material, for example teflon or polymethylene carbonate instead of glass.

What is claimed is:

1. A method of isothermally manufacturing crystals comprising preparing a saturated aqueous solution of a water soluble ionizable salt the dissociated cation of which is less reducible than H+ and the dissociated anion of which is less oxidizable than OH$^-$, subjecting said saturated solution to electrolysis while preventing evaporation thereby causing said solution to lose water under isothermal conditions and crystals of said salt to form.

2. The method of claim 1 wherein a seed crystal of said salt is introduced into said solution and crystallization occurs on said seed crystal.

3. The method of claim 2 wherein the pH of the solution is adjusted to a desired level.

4. The method of claim 5 wherein said seed crystal is rotated while in said solution.

5. The method of claim 2 wherein the solution is cooled by an external source just sufficiently to compensate for the heat evolved during electrolysis.

6. The method of claim 2 wherein a water immiscible liquid film is floated on top of said solution.

7. The method of claim 1 wherein the temperature of the aqueous solution is between 0°C and 100°C.

8. The method of claim 1 wherein crystals of a lanthanide sulfate are manufactured.

9. A device for isothermic crystallization of a water-soluble inoizable salt, said device comprising a container for holding a quantity of said solution, means for controlling the temperature of said solution while in said container, means for suspending a seed crystal of said salt in said solution and water removal means for causing said solution to become supersaturated and crystallization of said salt to take place on said seed crystal, said water removal means comprising anode and cathode electrodes suspended in said solution and connected to a supply of direct current and suitable for causing electrolysis of said solution.

10. The device of claim 9 wherein in addition to reflux condenser is positioned over said container so as to return water vapor to said solution.

* * * * *